(12) United States Patent
Lin

(10) Patent No.: US 6,303,504 B1
(45) Date of Patent: *Oct. 16, 2001

(54) METHOD OF IMPROVING PROCESS ROBUSTNESS OF NICKEL SALICIDE IN SEMICONDUCTORS

(75) Inventor: Xi-Wei Lin, Fremont, CA (US)

(73) Assignee: VLSI Technology, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,364

(22) Filed: Feb. 26, 1998

(51) Int. Cl.[7] .................................................. H01L 21/44
(52) U.S. Cl. ........................ 438/683; 438/299; 438/592; 438/655; 438/649; 438/664
(58) Field of Search ............................ 438/683, 592, 438/649, 300–307, 651, 663–664, 655, 656, 299, 660–661

(56) References Cited

U.S. PATENT DOCUMENTS

| | | | |
|---|---|---|---|
| 5,027,185 | * | 6/1991 | Liauh ...................................... 357/59 |
| 5,041,394 | * | 8/1991 | Spratt et al. ........................... 438/533 |
| 5,498,569 | | 3/1996 | Eastep . |
| 5,567,651 | | 10/1996 | Berti et al. . |
| 5,635,426 | | 6/1997 | Hayashi et al. . |
| 5,635,765 | | 6/1997 | Larson . |
| 5,646,070 | | 7/1997 | Chung . |
| 5,656,546 | | 8/1997 | Chen et al. . |
| 5,668,040 | | 9/1997 | Byun . |
| 5,795,808 | * | 8/1998 | Park ...................................... 438/301 |
| 5,924,010 | * | 7/1999 | Chen et al. ........................... 438/653 |

FOREIGN PATENT DOCUMENTS

402039528 * 2/1990 (JP) ...................................... 438/655

OTHER PUBLICATIONS

Wolf, silicon processing for the VLSI ERA, vol. 1, pp. 399, 359–362, 1986.*

Wolf "Silicon Processing for the VLSI Era" vol. 1, pp. 397–399, 1986.*

* cited by examiner

Primary Examiner—Charles Bowers
Assistant Examiner—Thanh Nguyen
(74) Attorney, Agent, or Firm—Mikio Ishimaru

(57) ABSTRACT

After a metal deposition preclean, a very thin titanium layer is deposited followed by a thick nickel layer on a semiconductor silicon substrate. The titanium and nickel are deposited sequentially in a vacuum cluster tool to prevent oxidation of titanium in air. The silicon substrate and the metal layers are subject to a relatively low temperature anneal. The annealing causes the titanium to act as a reductant to break up the residual surface oxide on the surface of the silicon substrate and allows the nickel to react with the silicon substrate to form nickel silicide.

10 Claims, 1 Drawing Sheet

METHOD OF IMPROVING PROCESS ROBUSTNESS OF NICKEL SALICIDE IN SEMICONDUCTORS

TECHNICAL FIELD

The present invention relates generally to semiconductor manufacturing technology and more specifically to the nickel salicide process in semiconductor manufacturing.

BACKGROUND ART

The nickel salicide (self-aligned silicidation) process has been considered as a possible replacement for the traditional titanium salicide process on source/drain and polysilicon gate regions in semiconductors because of the lack of linewidth dependence of nickel silicide. While titanium disilicide increases in sheet resistance with decreasing linewidth, nickel monosilicide has a sheet resistance which gradually decreases with linewidth.

Also, the nickel salicide process has been considered as a possible replacement for the traditional titanium salicide process because of its processing simplicity. While the titanium salicide process involves two rapid thermal anneals at 700° C. and 850° C., the nickel salicide process only needs one rapid thermal anneal at a lower temperature between 400° C. to 600° C.

However, the nickel salicide process has not become a comprehensive replacement because it is subject to process variation not only because nickel is a less reactive metal in contact with silicon oxide, but also because the rapid thermal anneal temperatures for nickel are too low to initiate silicon oxide reduction. This means that the residual surface silicon oxide on the surface of the silicon substrate will interfere with the transition of nickel to nickel silicide during the annealing step. On the other hand, the titanium salicide process is known to be robust partially thanks to the ability of titanium to reduce surface silicon oxide and readily react with the silicon substrate.

As a result of the aforegoing, despite the advantages of nickel, titanium has been the metal of choice for a long time. A solution to these problems has been long sought but elusive to those skilled in the art.

DISCLOSURE OF THE INVENTION

The present invention provides the advantage of reducing the process variation of a nickel salicide process by the deposition of a very thin titanium layer on the silicon substrate followed by a layer of nickel of the desired thickness. The combination is then subject to a rapid thermal annealing step. The titanium acts as a reductant to break up the residual surface silicon oxide on the silicon surface and promotes the reaction of the nickel with the silicon in the silicon substrate to form nickel silicide.

The invention provides that the titanium and nickel are deposited sequentially in a vacuum cluster tool to prevent oxidation of the titanium by air.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
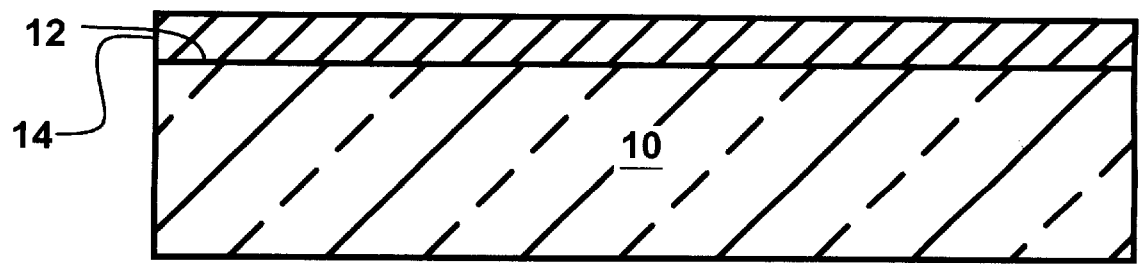
FIG. 1 is a cross-section of a semiconductor silicon substrate after the deposition of titanium.

Referring now to FIG. 1, therein is shown a cross-section of a semiconductor silicon substrate 10. The silicon substrate 10 has a surface 12 upon which there are areas of residual surface oxide (not shown) under a deposited layer of titanium 14.

Figure 2:
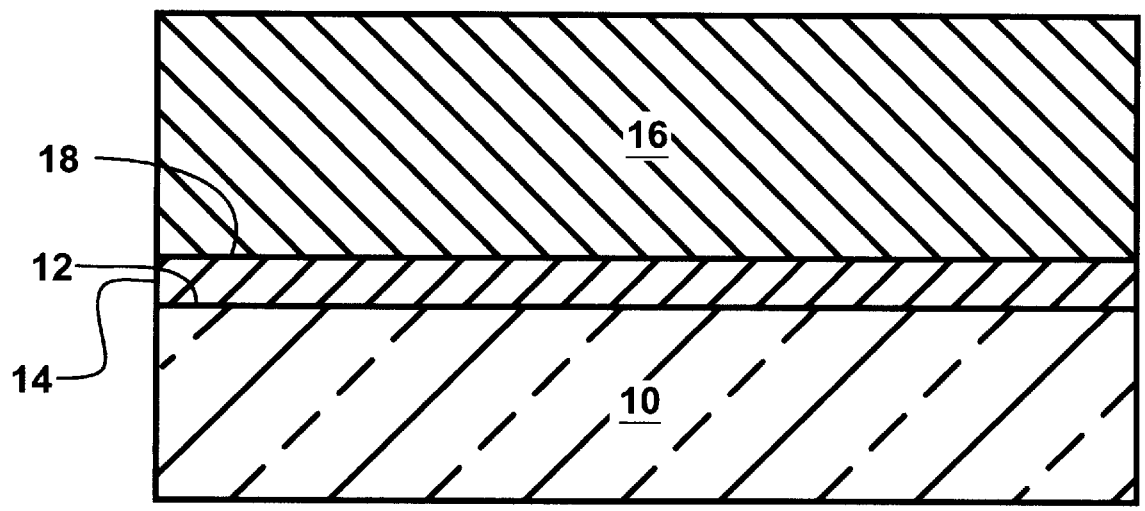
FIG. 2 is the semiconductor silicon substrate after deposition of titanium and nickel.

Referring now to FIG. 2, therein is shown the silicon substrate 10, the layer of titanium 14 and a layer of nickel 16 which has been deposited on a surface 18 of the layer of titanium 14.

Figure 3:
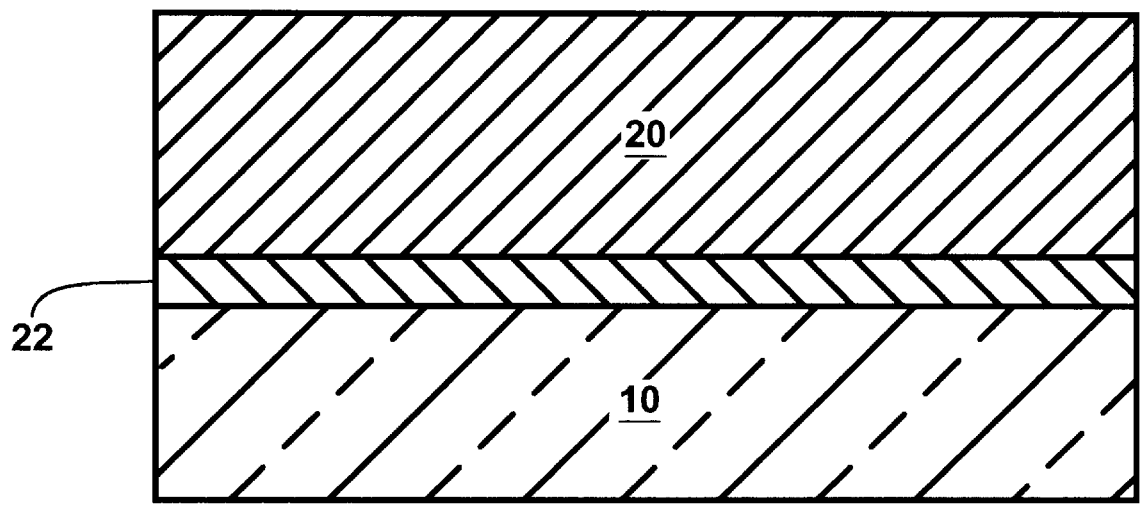
FIG. 3 is the semiconductor silicon substrate after rapid thermal anneal.

Referring now to FIG. 3, therein is shown the silicon substrate 10 with the residual surface oxide eliminated and all the nickel 16 transformed into nickel silicide 20. The layer of titanium 14 is shown converted into a layer of mixed titanium oxide and titanium silicide 22.

In the method of the present invention, the silicon substrate 10 is shown after a metal deposition precleaning step which cleans the surface 12. It should be understood that even after the precleaning step, there will continue to be remaining residual surface silicon oxide on various areas of the surface 12. It is this oxide which is problematic.

After the precleaning, a very thin layer of titanium 14 is deposited. The methods of deposition are well known to those skilled in the art to be some form of vacuum deposition. In the best mode, the titanium 14 would be deposited to a thickness of only 5 to 50 angstroms. This is shown in FIG. 2.

After the titanium 14 has been deposited, a layer of nickel 16 as shown in FIG. 2 will be deposited on top in direct contact with the titanium 14. The methods of deposition are well known to those skilled in the art to also be some form of vacuum deposition. And in the best mode, the nickel 16 would be deposited to a thickness of 200 to 500 angstroms although it may be to any desired thickness. It would be understood by those skilled in the art that as linewidths get smaller, these thicknesses would be reduced accordingly.

The titanium 14 should not be allowed to develop an intervening layer of oxide which would prevent bonding of another metal. As a result, the titanium 14 would be deposited in a vacuum and sequentially, the next metal, the nickel 16, would then be deposited in the same vacuum, preferably in the same vacuum cluster tool.

The silicon substrate 10 and the layers of titanium 14 and nickel 16 are then subjected to a rapid thermal anneal. The rapid thermal anneal causes the titanium 14 to act as a reductant to break up the residual surface oxide on the silicon surface 10.

At the same time, the rapid thermal anneal promotes the reaction of the nickel 16 with the silicon in the silicon substrate 10 migrating through the layer of mixed titanium oxide and titanium silicide 22 to form the desired nickel silicide 20. The exact composition of the layer of mixed titanium oxide and titanium silicide 22 depends upon the amount of residual surface oxide reduced by the titanium 14. Due to the low temperature of the rapid thermal anneal, the nickel 16 would not reduce the surface oxide even if the two were in contact.

In experimentation, it has been determined that a sufficiently thick layer of titanium heated to 400° C. reduces up to 50 angstroms of silicon oxide.

In the best mode, the rapid thermal anneal will be 400° C. and 500° C. although temperatures up to 600° C. can be used. The time for the rapid thermal anneal would be the 30 seconds.

After the nickel silicide 20 has formed, any unreacted nickel 16 and unreacted titanium 14 will be stripped off. In a semiconductor device, there will be areas of silicon dioxide which will prevent the metals above them from being converted to the silicides. It is these unreacted metals which will be removed. A typical stripping agent is sulfuric peroxide in solution.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing semiconductor devices on a silicon substrate, comprising the steps of:
   precleaning the silicon substrate;
   deposition of a first metal on the silicon substrate in a vacuum;
   deposition of a second metal in direct contact on said first metal deposition in sequence and in the same vacuum as the deposition of the first metal;
   a single rapid thermal annealing of the silicon substrate, said first metal, and said second metal to cause said first metal to reduce the residual surface compounds on said silicon substrate and to promote the reaction of said second metal with said silicon substrate to react to form second metal silicide; and
   stripping unreacted metals.

2. The method as claimed in claim 1 wherein the deposition of first metal is between 5 and 50 angstroms thick.

3. The method as claimed in claim 1 wherein the deposition of second metal is between 200 and 500 angstroms thick.

4. The method as claimed in claim 1 wherein the rapid thermal annealing is done at between 400° C. and 600° C.

5. A method for manufacturing semiconductor devices on a silicon substrate, comprising the steps of:
   precleaning the silicon substrate;
   deposition of titanium on the silicon substrate in a vacuum;
   deposition of nickel in direct contact on said titanium deposition in sequence and in the same vacuum as the deposition of the titanium;
   a single rapid thermal annealing of the silicon substrate, said titanium, and said nickel to cause said titanium to reduce the residual surface oxides on said silicon and to promote the reaction of said nickel with said silicon substrate to form nickel silicide; and
   stripping unreacted titanium and unreacted nickel.

6. The method as claimed in claim 5 wherein the deposition of titanium is between 5 and 50 angstroms thick.

7. The method as claimed in claim 5 wherein the deposition of nickel is between 200 and 500 angstroms thick.

8. The method as claimed in claim 5 wherein the rapid thermal annealing is done at between 400° C. and 500° C.

9. The method as claimed in claim 5 wherein the steps of deposition of titanium and nickel are done in a single cluster tool whereby said titanium is not exposed to oxygen before deposition of nickel.

10. A method for manufacturing semiconductor devices on a silicon substrate having residual surface silicon oxide, comprising the steps of:
    precleaning the silicon substrate;
    deposition of between 5 and 50 angstroms of titanium on the silicon substrate in a vacuum;
    deposition of between 200 and 500 angstroms of nickel in direct contact on said titanium deposition in sequence and in the same vacuum as the deposition of the titanium;
    a single rapid thermal annealing of the silicon substrate, said titanium, and said nickel at between 400° C. and 500° C. to cause said titanium to reduce the residual surface silicon oxide on the silicon substrate and to promote the reaction of said nickel with the silicon substrate to form nickel silicide; and
    stripping unreacted titanium and unreacted nickel.

* * * * *